US011823985B2

(12) United States Patent
Araki

(10) Patent No.: US 11,823,985 B2
(45) Date of Patent: Nov. 21, 2023

(54) LEADFRAME, SEMICONDUCTOR DEVICE, AND METHOD FOR MANUFACTURING SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Koji Araki, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/470,078

(22) Filed: Sep. 9, 2021

(65) Prior Publication Data

US 2022/0148945 A1 May 12, 2022

(30) Foreign Application Priority Data

Nov. 12, 2020 (JP) ................................ 2020-188506

(51) Int. Cl.
*H01L 23/495* (2006.01)
*H01L 23/31* (2006.01)
*H01L 23/00* (2006.01)

(52) U.S. Cl.
CPC .... *H01L 23/49513* (2013.01); *H01L 23/3107* (2013.01); *H01L 23/49548* (2013.01); *H01L 24/83* (2013.01); *H01L 2224/83862* (2013.01)

(58) Field of Classification Search
CPC ...................... H01L 2224/16245–1626; H01L 2224/32245–3226; H01L 23/49541–49565; H01L 23/49838–49844; H01L 23/49534; H01L 23/49582; H01L 23/49866–49888; H01L 23/49894; H01L 23/49586; H01L 23/14
See application file for complete search history.

(56) References Cited

U.S. PATENT DOCUMENTS

2021/0280532 A1* 9/2021 Suzuki .................... H01L 24/73

FOREIGN PATENT DOCUMENTS

| JP | S62117354 A | 5/1987 |
|---|---|---|
| JP | H11121680 A | 4/1999 |
| JP | 2013048150 A | 3/2013 |

* cited by examiner

*Primary Examiner* — Julio J Maldonado
*Assistant Examiner* — Stanetta D Isaac
(74) *Attorney, Agent, or Firm* — Kim & Stewart LLP

(57) ABSTRACT

A leadframe includes a first frame part and a second frame part. The first frame part includes a bed portion including a first section being thin in a first direction, a first support portion, a first lead portion positioned between the bed portion and the first support portion in a second direction, the first lead portion being connected with the bed portion and the first support portion, a first extension portion being connected to the bed portion, and a second extension portion separated from the first extension portion in a third direction and connected to the bed portion. The second frame part includes a second support portion connected to the first and second extension portions, and a second lead portion connected to the second support portion.

7 Claims, 13 Drawing Sheets

LEADFRAME, SEMICONDUCTOR DEVICE, AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2020-188506, filed on Nov. 12, 2020; the entire contents of which are incorporated herein by reference.

FIELD

Embodiments relate to a leadframe, semiconductor device, and a method for manufacturing the semiconductor device.

BACKGROUND

One type of semiconductor device is sealed with a resin or the like. The semiconductor device that is sealed with the resin or the like includes, for example, a bed portion to which a semiconductor element is mounted, a lead portion that is used as a terminal connected with an external power supply, a bonding wire that electrically connects the lead portion and an electrode of the semiconductor element, the resin that seals the semiconductor element, the bed portion, and a portion of the lead portion, etc.

DETAILED DESCRIPTION

Figure 1A:
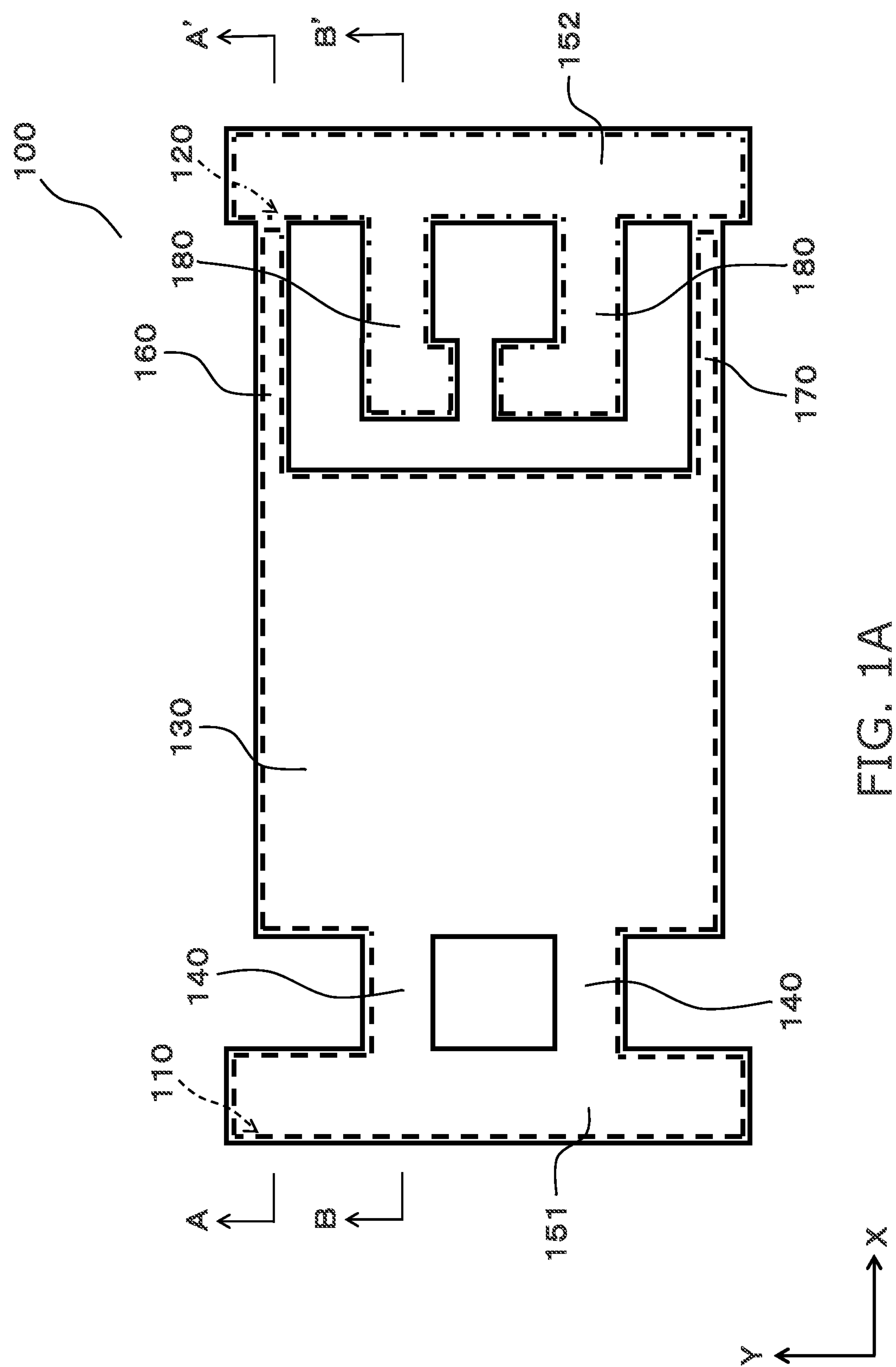
FIG. 1A is a plan view of a leadframe 100 according to a first embodiment.

A leadframe according to one embodiment, includes a first frame part and a second frame part. The first frame part includes a bed portion including a first section, a thickness in a first direction of the first section being thin, a first support portion, a first lead portion positioned between the bed portion and the first support portion in a second direction crossing the first direction, the first lead portion being connected with the bed portion and the first support portion, a first extension portion positioned at a side opposite to the first lead portion in the second direction, the first extension portion being connected to the bed portion, and a second extension portion separated from the first extension portion in a third direction crossing the first and second directions, the second extension portion being connected to the bed portion. The second frame part includes a second support portion connected to the first and second extension portions, and a second lead portion positioned between the bed portion and the second support portion in the second direction, the second lead portion being connected to the second support portion.

A semiconductor device according to one embodiment, includes a bed portion, a first lead portion, a first extension portion, a second extension portion, a second lead portion, a semiconductor element, and a resin. The bed portion includes a first section. A thickness in a first direction of the first section is thin. The first lead portion is connected with the bed portion. The first extension portion is connected to the bed portion at a side opposite to the first lead portion in a second direction crossing the first direction. The second extension portion is separated from the first extension portion in a third direction crossing the first and second directions. The second extension portion is connected to the bed portion. The second lead portion is located between the first extension portion and the second extension portion in the second direction. The second lead portion is separated from the bed portion. The semiconductor element is located on the bed portion. The resin covers at least a part of the bed portion, the first lead portion, the first extension portion, the second extension portion, the second lead portion, and the semiconductor element.

Embodiments of the invention will now be described with reference to the drawings. Common portions in all of the drawings of the description are marked with common reference numerals. The dimensional ratios of the drawings are not limited to the illustrated ratios. The embodiments do not limit the invention.

First Embodiment

Structure of Leadframe 100

Figure 1B:
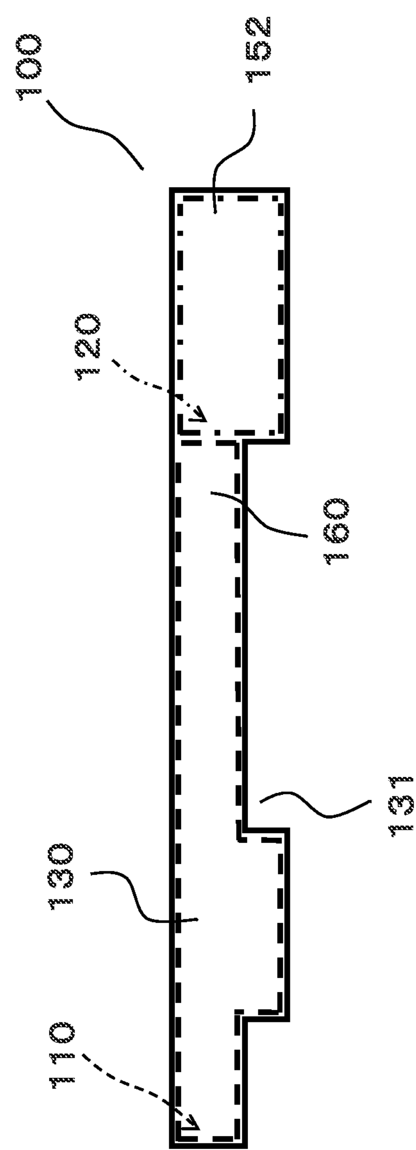
FIG. 1B is a cross-sectional view along line A-A' shown in FIG. 1A.
Figure 1C:
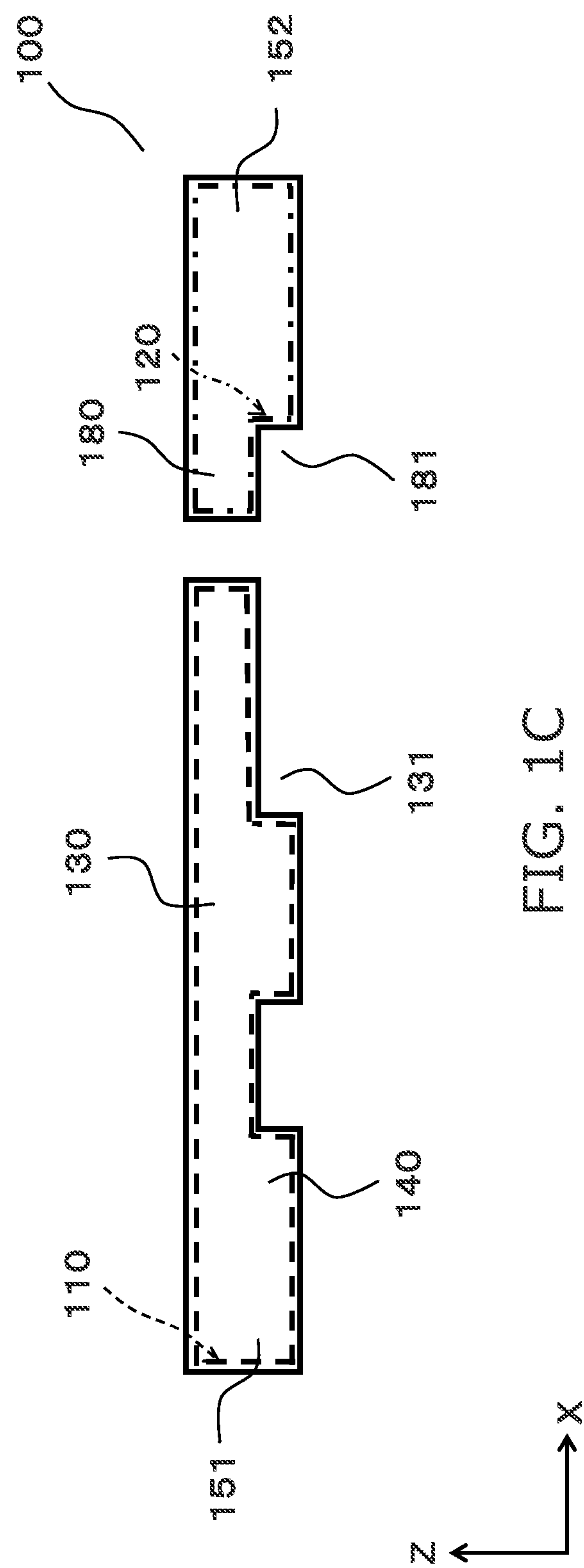
FIG. 1C is a cross-sectional view along line B-B' shown in FIG. 1A.
Figure 1D:
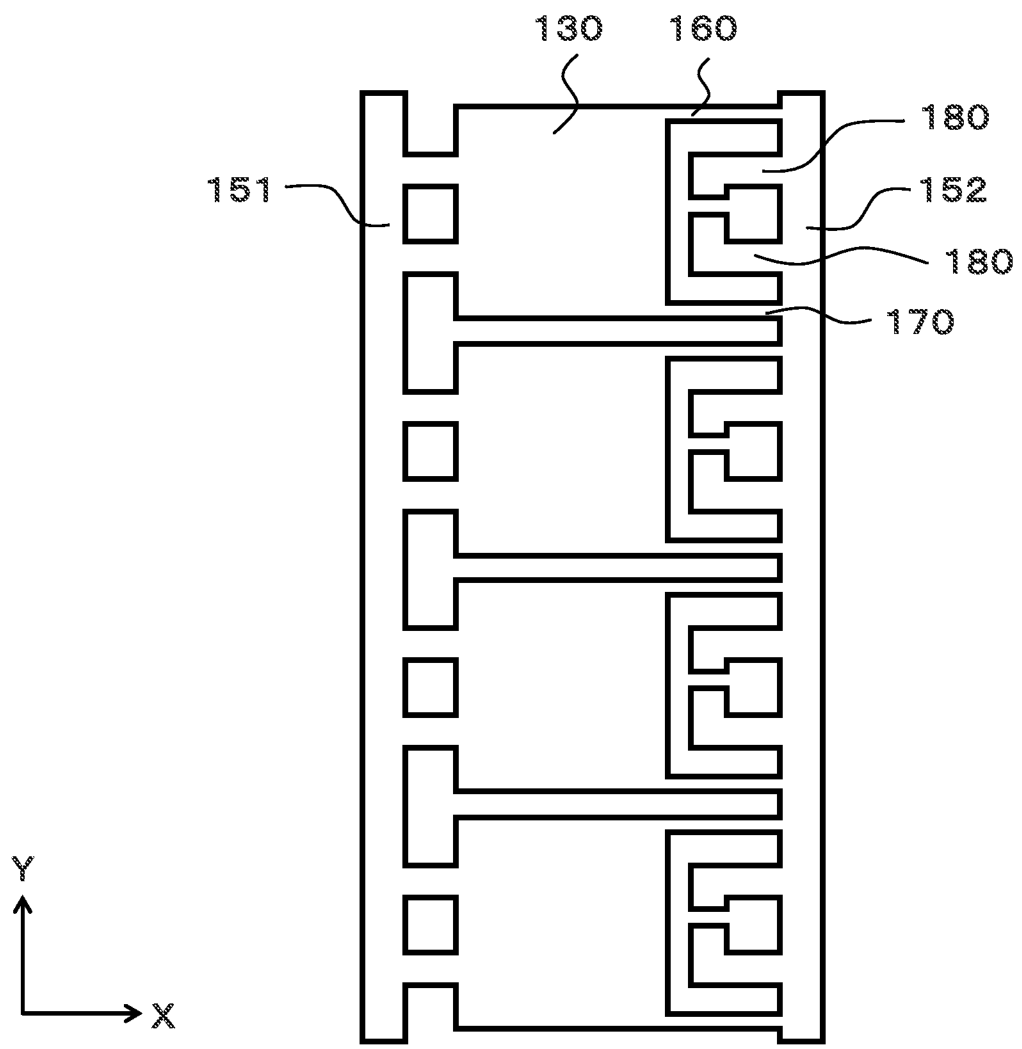
FIG. 1D is a general view of the leadframe 100 according to the first embodiment.

A leadframe 100 according to a first embodiment will now be described with reference to FIGS. 1A to 1D. FIG. 1A is a plan view of the leadframe 100 according to the first embodiment; FIG. 1B is a cross-sectional view along line A-A' shown in FIG. 1A; FIG. 1C is a cross-sectional view along line B-B' shown in FIG. 1A; and FIG. 1D is a general view of the leadframe 100 according to the first embodiment.

The leadframe 100 includes a first frame part 110 and a second frame part 120. The first frame part 110 includes a bed portion 130, a first lead portion 140, a first support portion 151, a first extension portion 160, and a second extension portion 170. The second frame part 120 includes a second lead portion 180 and a second support portion 152. In the drawings, the first frame part 110 is shown by a dashed line; and the second frame part 120 is shown by a single dot-dash line.

The thickness direction of the leadframe 100 is taken as a Z-direction (a first direction). A direction orthogonal to the Z-direction is taken as an X-direction (a second direction); and a direction orthogonal to the X-direction and the Z-direction is taken as a Y-direction (a third direction). FIG. 1A is a plan view of the leadframe 100 in the X-Y plane; FIGS. 1B and 1C are cross-sectional views of the leadframe 100 in the X-Z plane. Although the X-direction, the Y-direction, and the Z-direction according to the embodiment have an orthogonal relationship, the relationship is not limited to orthogonal; it is sufficient to cross each other.

As shown in FIGS. 1B and 1C, the first lead portion 140 is positioned between the bed portion 130 and the first support portion 151 in the X-direction and is connected to the bed portion 130 and the first support portion 151. In other words, the bed portion 130, the first lead portion 140, and the first support portion 151 are a continuous body. The first support portion 151 has a structure that extends in the Y-direction. As an example according to the embodiment, two first lead portions 140 are arranged in the Y-direction.

The first extension portion 160 and the second extension portion 170 are positioned between the bed portion 130 and the second support portion 152 in the X-direction and are connected to the bed portion 130 and the second support portion 152. In other words, the bed portion 130, the first extension portion 160, the second extension portion 170, and the second support portion 152 are a continuous body. The first extension portion 160, the second extension portion 170, and the second support portion 152 are located at the side opposite to the first lead portion 140 and the first support portion 151 in the X-direction. The second support portion 152 has a structure that extends in the Y-direction. The second extension portion 170 is separated from the first extension portion 160 in the Y-direction.

The bed portion 130 includes a first thin plate portion 131 (a first section); and the thickness in the Z-direction of the first thin plate portion 131 is thin. The first thin plate portion 131 described above is formed at the second support portion 152 side of the bed portion 130; and the thickness in the Z-direction of the first thin plate portion 131 is equal to the thicknesses in the Z-direction of the first and second extension portions 160 and 170.

The second lead portion 180 is located between the bed portion 130 and the second support portion 152 in the X-direction and between the first extension portion 160 and the second extension portion 170 in the Y-direction. Although the second lead portion 180 is connected with the second support portion 152, the second lead portion 180 is separated from the bed portion 130, the first extension portion 160, and the second extension portion 170. As shown in FIG. 1C, the second lead portion 180 includes a second thin plate portion 181 (a second section) at the bed portion 130 side; and the thickness in the Z-direction of the second thin plate portion 181 is thin. To ensure the breakdown voltage and suppress shorts, it is desirable for the fill volume of a resin 250 to be large at the region where the second lead portion 180 approaches the first lead portion 140 and the bed portion 130 to which a different potential is applied. Therefore, from the perspective of the reliability of the semiconductor device, it is desirable to ensure the fill volume of the resin 250 by providing the first thin plate portion 131 in the bed portion 130 and providing the second thin plate portion 181 in the second lead portion 180. It is desirable for the thickness in the Z-direction of the first thin plate portion 131 to be not more than ½ of the thickness in the Z-direction of the section other than the first thin plate portion 131. Similarly, it is desirable for the thickness in the Z-direction of the second thin plate portion 181 to be not more than ½ of the thickness in the Z-direction of the section other than the second thin plate portion 181.

As described above, the leadframe 100 has a structure in which the first support portion 151, the first lead portion 140, the bed portion 130, the first extension portion 160, the second extension portion 170, the second lead portion 180, and the second support portion 152 are a continuous body. The component members of the leadframe 100 are made of, for example, copper (Cu).

In FIGS. 1A to 1D, the bed portion 130 also includes a section at the first support portion 151 side that is thin like the first thin plate portion 131. The thin section of the bed portion 130 that is formed at the first support portion 151 side is covered with the resin 250 in the semiconductor device 200 manufactured using the leadframe 100 described below. Therefore, in the X-direction, the thin section of the bed portion 130 that is formed at the first support portion 151 side is located between the first lead portion 140 of which a portion is exposed outside the resin to form an external terminal and the section of the bed portion 130 that is thick in the Z-direction and includes a portion exposed outside the resin 250. For example, solder is used when mounting the semiconductor device 200 to a substrate (i.e., when mounting the first lead portion 140 to the substrate). The properties of solder are such that the solder does not adhere to the resin 250. Therefore, the resin 250 that covers the thin section of the bed portion 130 formed at the first support portion 151 side can prevent the solder adhered to the first lead portion 140 from flowing in the X-direction and adhering to the bed portion 130 that is exposed outside the resin 250. Although the purpose of providing the thin plate portion at the first support portion 151 side is described above, the embodiment can be implemented without providing the thin plate portion at the first support portion 151 side.

When manufacturing the semiconductor device 200 described below, a leadframe is used as an example in which the leadframes 100 such as that shown in FIG. 1D are repeatedly provided in the Y-direction and formed into a continuous structure via the first and second support portions 151 and 152. The leadframe 100 shown in FIG. 1A is simply used in the following description.

Structure of Semiconductor Device 200

The structure of a semiconductor device 200 that uses the leadframe 100 will now be described with reference to FIGS. 2A to 2C.

Figure 2A:
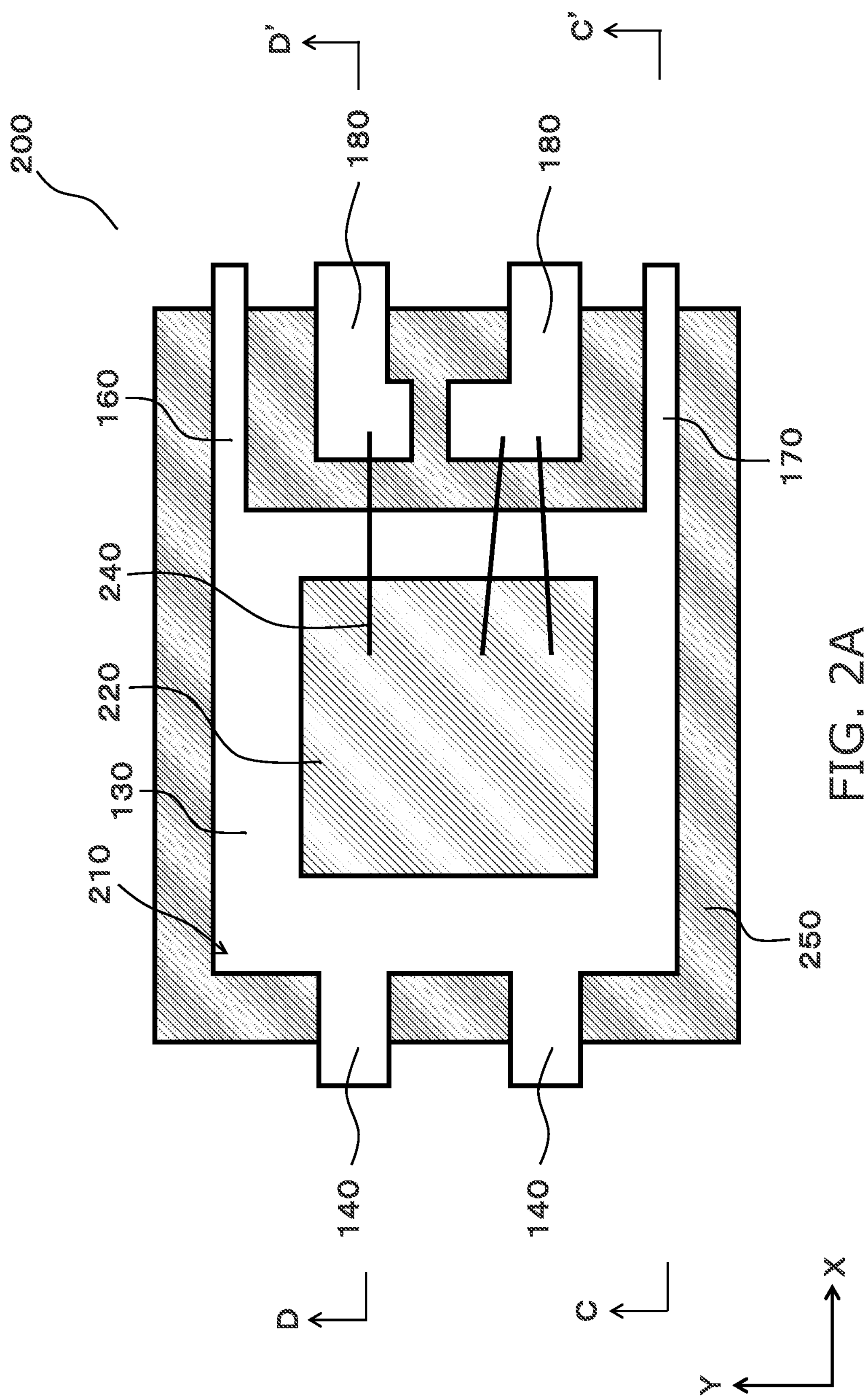
FIG. 2A is a plan view of a semiconductor device 200 according to the first embodiment.
Figure 2B:
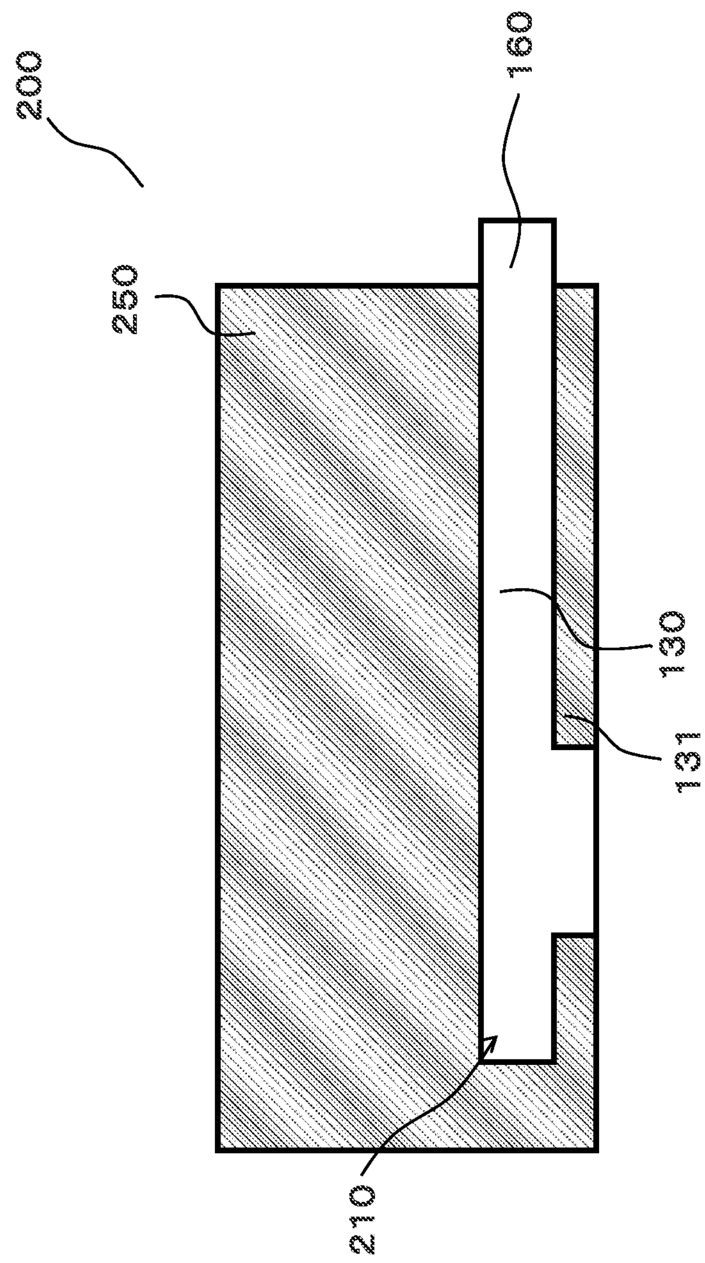
FIG. 2B is a cross-sectional view along line C-C' shown in FIG. 2A.
Figure 2C:
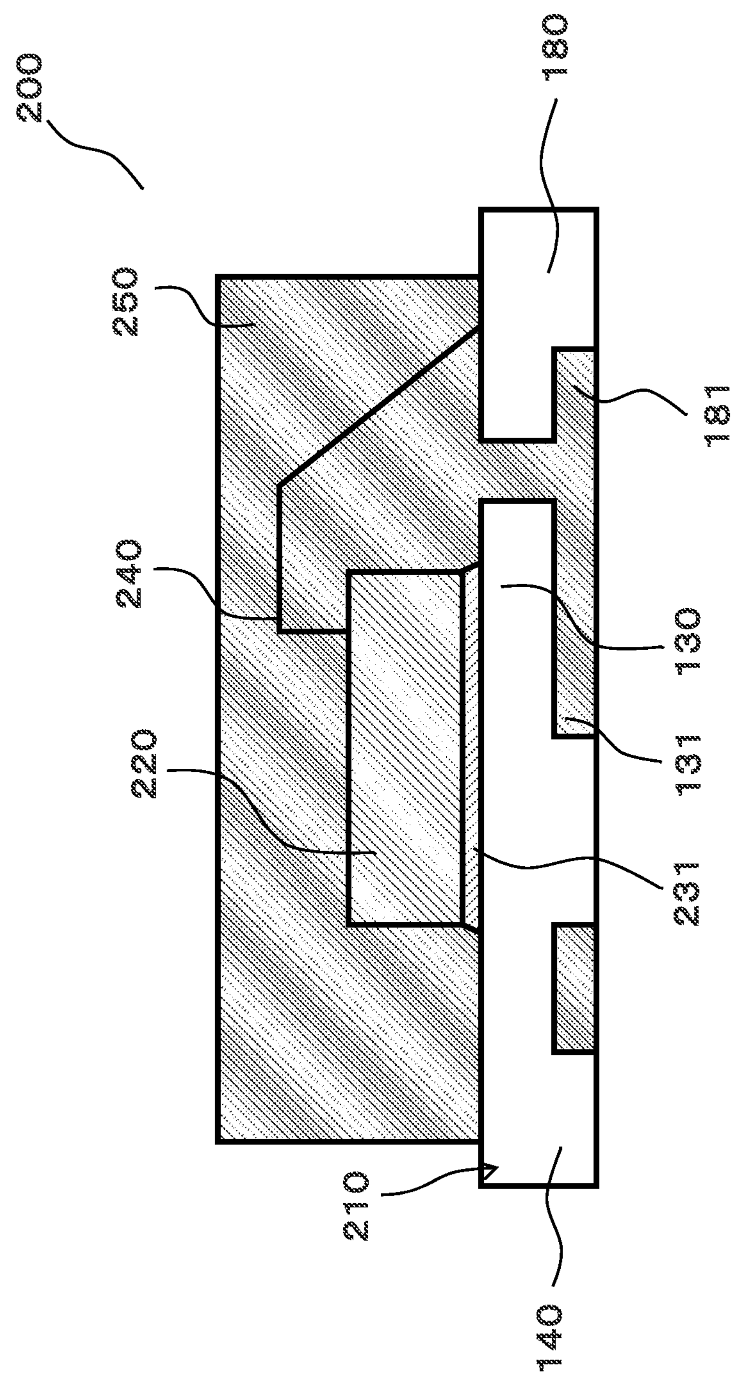
FIG. 2C is a cross-sectional view along line D-D' shown in FIG. 2A.

FIG. 2A is a plan view of the semiconductor device 200 according to the first embodiment; FIG. 2B is a cross-sectional view along line C-C' shown in FIG. 2A; and FIG. 2C is a cross-sectional view along line D-D' shown in FIG. 2A. In FIG. 2A, the resin 250 is see-through to view the internal structure.

The semiconductor device 200 includes the bed portion 130, the first lead portion 140, the first extension portion 160, the second extension portion 170, a semiconductor element 220, a bonding material 231, a bonding wire 240 (a current path member), and the resin 250.

The semiconductor element 220 is, for example, a vertical MOSFET in which a drain electrode (not illustrated) is formed at the lower surface in the Z-direction, a source electrode and a gate electrode (not illustrated) are formed at the upper surface, and a current flows from the lower surface to the upper surface. The semiconductor element 220 is not limited to a MOSFET and may be an IGBT, etc. The semiconductor element 220 includes, for example, silicon (Si), silicon carbide (SiC), gallium nitride (GaN), etc.

The bed portion 130 includes the first thin plate portion 131. The first lead portion 140 is connected with the bed portion 130 in the X-direction. In other words, the bed portion 130 and the first lead portion 140 are a continuous body. As an example according to the embodiment, two first lead portions 140 are arranged in the Y-direction.

The first extension portion 160 and the second extension portion 170 are connected with the bed portion 130 in the X-direction. In other words, the bed portion 130, the first extension portion 160, and the second extension portion 170 are a continuous body. The first extension portion 160 and the second extension portion 170 are located at the side opposite to the first lead portion 140 in the X-direction.

The second lead portion 180 is separated from the bed portion 130 in the X-direction and located between the first extension portion 160 and the second extension portion 170 in the Y-direction. The second lead portion 180 is separated from the first and second extension portions 160 and 170. As an example according to the embodiment, two second lead portions 180 are arranged in the Y-direction and are separated from each other.

The drain electrode of the semiconductor element 220 is electrically connected via the bonding material 231 to the surface of the bed portion 130 opposite to the first thin plate portion 131 side in the Z-direction.

The bonding wire 240 electrically connects the source electrode of the semiconductor element 220 and one of the second lead portions 180. The bonding wire 240 also electrically connects the gate electrode of the semiconductor element 220 and the other of the second lead portions 180.

Although a metal wire is illustrated as the bonding wire 240 according to the embodiment, a connector plate also is applicable. The bonding wire 240 includes, for example, Cu. The drain electrode, source electrode, and gate electrode of the semiconductor element 220 include, for example, aluminum (Al). The bonding material 231 includes, for example, solder. The solder is, for example, a Sn-antimony (Sb)-silver (Ag)-based solder.

The resin 250 covers at least a part of the bed portion 130, the first lead portion 140, the first extension portion 160, the second extension portion 170, the second lead portion 180, the semiconductor element 220, and the bonding wire 240. Specifically, a portion of the first lead portion 140 at the side of the first lead portion 140 opposite to the side that is connected with the bed portion 130 is exposed outside the resin 250 as an external terminal; and a portion of the second lead portion 180 at the side of the second lead portion 180 opposite to the bed portion 130 in the X-direction is exposed outside the resin 250 as an external terminal. The resin 250 includes, for example, an epoxy resin.

Method for Manufacturing Leadframe 100 and Semiconductor Device 200

First, a method for manufacturing the leadframe 100 will be described. The leadframe 100 is formed into the shape of the leadframe 100 such as that shown in FIGS. 1A to 1D by pressing or etching a plate made of metal.

The first thin plate portion 131 and the second thin plate portion 181 of the leadframe 100 are formed by pressing or etching.

Figure 3A:
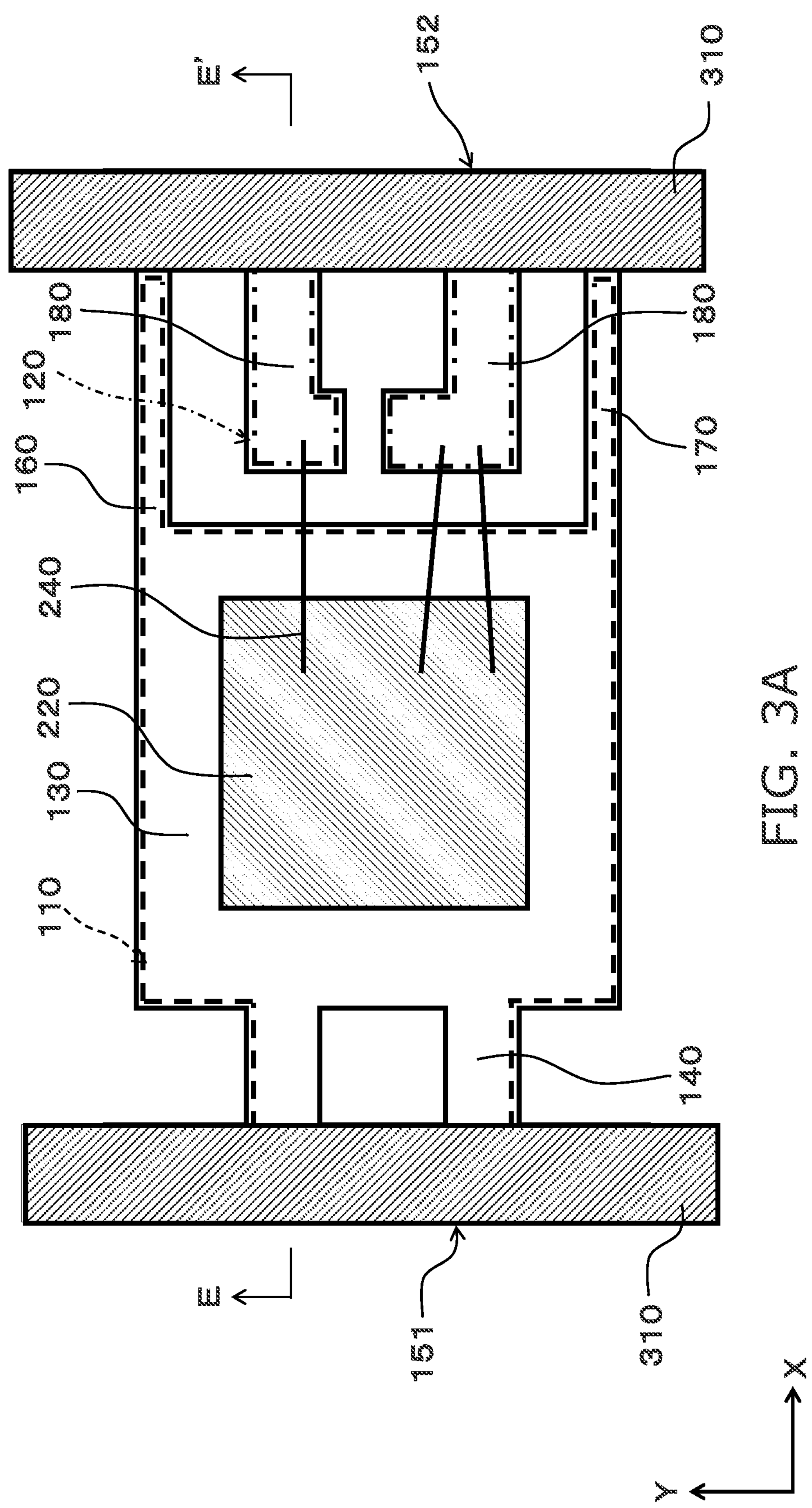
FIG. 3A is a plan view showing a method for manufacturing the semiconductor device 200 according to the first embodiment.
Figure 3B:
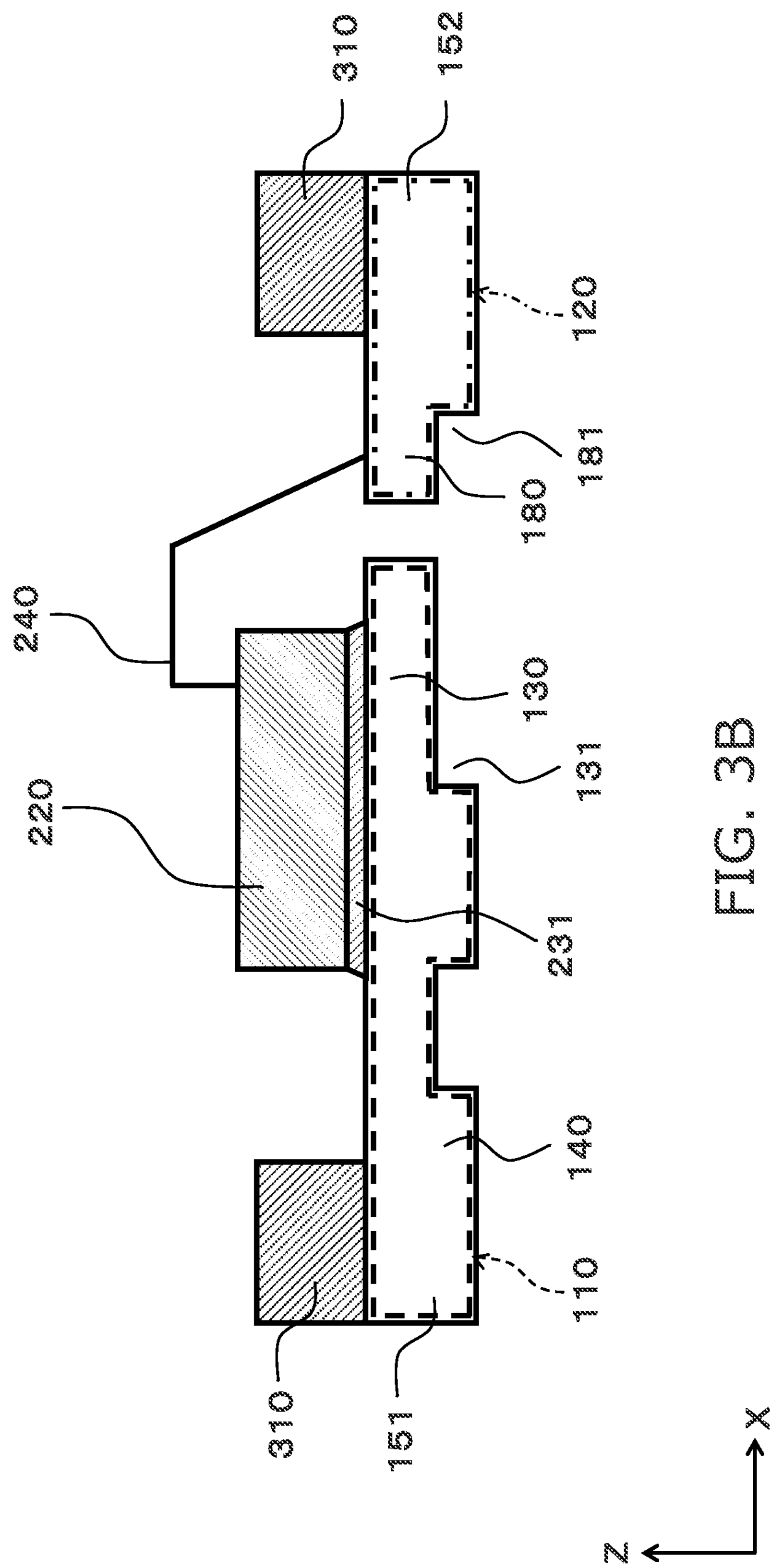
FIG. 3B is a cross-sectional view along E-E' shown in FIG. 3A.

Continuing, the method for manufacturing the semiconductor device 200 will be described with reference to FIGS. 3A and 3B. FIGS. 3A and 3B show the method for manufacturing the semiconductor device 200; FIG. 3A is a plan view showing the method for manufacturing the semiconductor device 200 according to the first embodiment; and FIG. 3B is a cross-sectional view along line E-E' shown in FIG. 3A.

First, as shown in FIG. 3A, the first and second support portions 151 and 152 of the leadframe 100 shown in FIGS. 1A to 1D are fixed with a fixing member 310. The fixing member 310 includes, for example, tape, etc.

Then, as shown in FIG. 3B, the bonding material 231 is coated onto the bed portion 130; and the semiconductor element 220 is mounted so that the bonding material 231 contacts the drain electrode at the semiconductor element 220 lower surface.

Subsequently, the bonding material 231 is melted by increasing the temperature in a reflow furnace. Subsequently, the bed portion 130 and the drain electrode of the semiconductor element 220 are electrically connected by fixing the bonding material 231 by reducing the temperature of the reflow furnace.

The second lead portions 180 and the source electrode and gate electrode of the semiconductor element 220 are electrically connected by the bonding wires 240 by using, for example, ultrasonic waves.

Then, a portion of the first frame part 110, a portion of the second frame part 120, the semiconductor element 220, and the bonding wire 240 are sealed (molded) with the resin 250. At this time, at least the lower surface of the section of the bed portion 130 other than the first thin plate portion 131 at the surface including the first thin plate portion 131 is exposed outside the resin 250. A portion of the first lead portion 140 at the side of the first lead portion 140 opposite to the side connected with the bed portion 130 and a portion of the second lead portion 180 at the side of the second lead portion 180 opposite to the first frame part 110 in the X-direction are completely exposed externally by removing the resin adhered to these portions.

Finally, the connection portion between the first lead portion 140 and the first support portion 151, the connection portion between the second lead portion 180 and the second support portion 152, the connection portion between the first extension portion 160 and the second support portion 152, and the connection portion between the second extension portion 170 and the second support portion 152 are cut by a dicing cutter, etc. The first support portion 151 and the second support portion 152 are cut off thereby. The semiconductor device 200 is formed by the processes described above.

Effects of First Embodiment

Figure 4A:
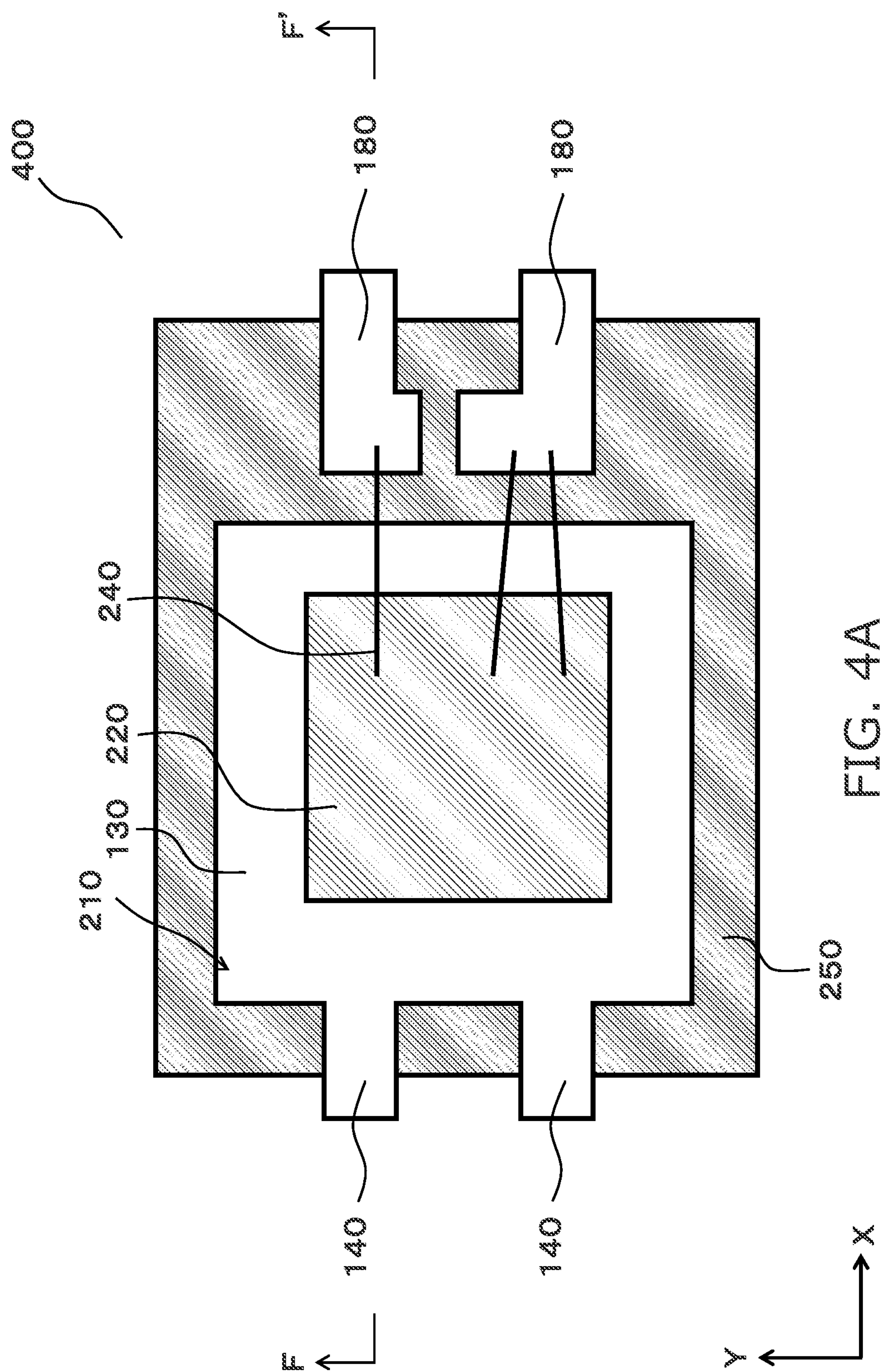
FIG. 4A is a plan view of a semiconductor device 400 of a comparative example.
Figure 4B:
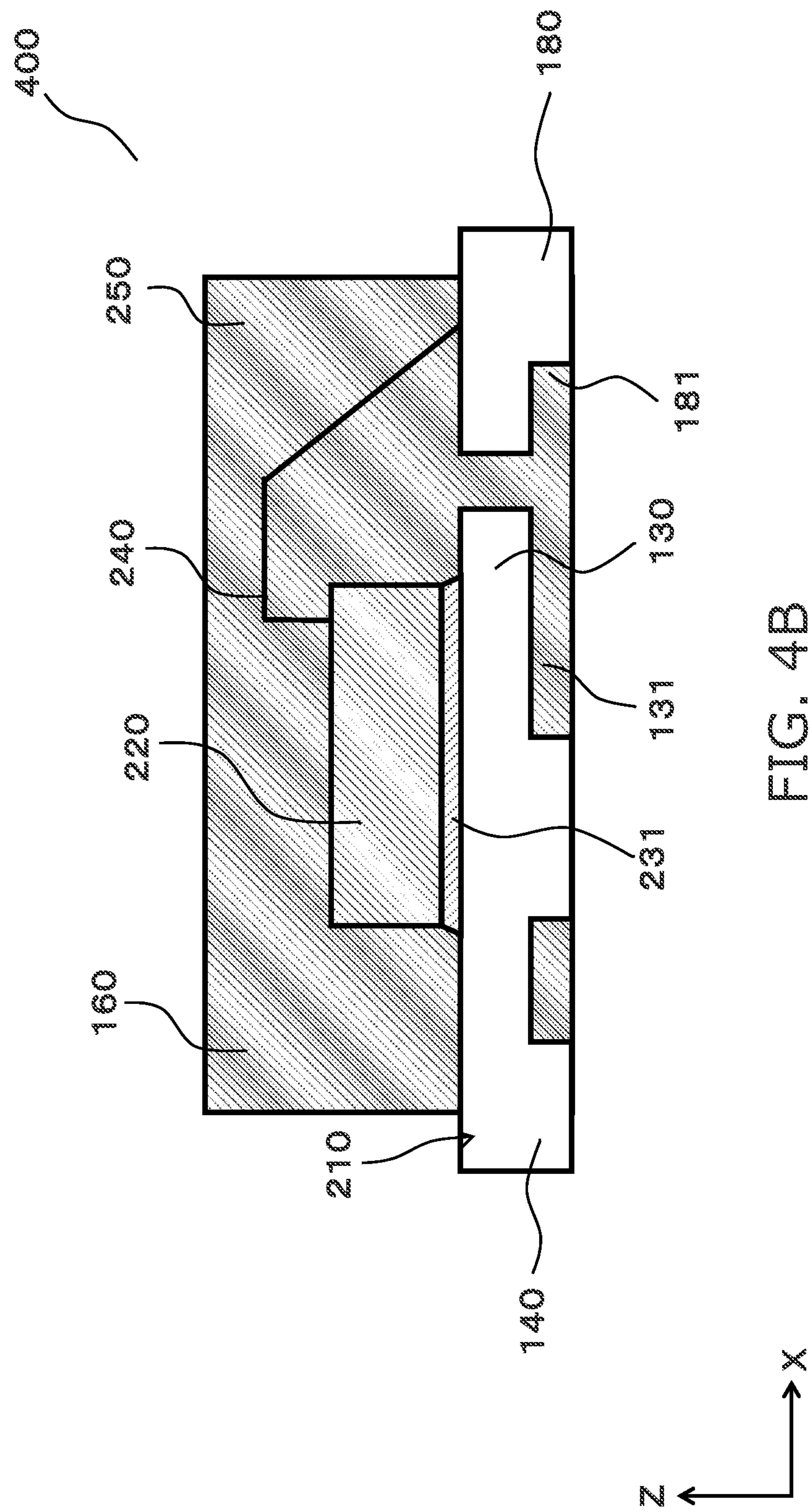
FIG. 4B is a cross-sectional view along line F-F' shown in FIG. 4A.

Effects of the semiconductor device 200 of the first embodiment will now be described using a semiconductor device 400 of a comparative example. FIG. 4A is a plan view of the semiconductor device 400 of the comparative example; and FIG. 4B is a cross-sectional view along line F-F' shown in FIG. 4A. The same portions as those of the semiconductor device 200 of the first embodiment are marked with the same reference numerals.

The semiconductor device 400 of the comparative example differs from the semiconductor device 200 of the first embodiment in that the first extension portion 160 and the second extension portion 170 are not included. In other words, the bed portion 130 to which the semiconductor element 220 is mounted and the lead portion 180 that is used as the external terminal are separated; and only the sealing resin 250 and the bonding wire 240 that electrically connects the lead portion 180 and the electrode of the semiconductor element 220 are included between the bed portion 130 and the lead portion 180. Therefore, when an external force (e.g., an external force in the Z-direction) is applied to the semiconductor device 400, the resin 250 mainly deforms with a starting point between the bed portion 130 and the second lead portion 180; and there is a risk that cracks may occur in the resin 250.

On the other hand, in the semiconductor device 200 of the first embodiment, the first extension portion 160 and the second extension portion 170 are located between the bed portion 130 and the resin 250 end portion at the side at which the second lead portion 180 is positioned. Therefore, when an external force (e.g., an external force in the Z-direction) is applied to the semiconductor device 200, the first extension portion 160 and the second extension portion 170 can suppress the deformation of the resin 250 due to the external force. Therefore, the semiconductor device 200 can suppress the occurrence of cracks in the resin 250.

Effects of the method for manufacturing the semiconductor device 200 according to the first embodiment will now be described by comparing to a method for manufacturing the semiconductor device 400 of the comparative example.

Figure 5A:
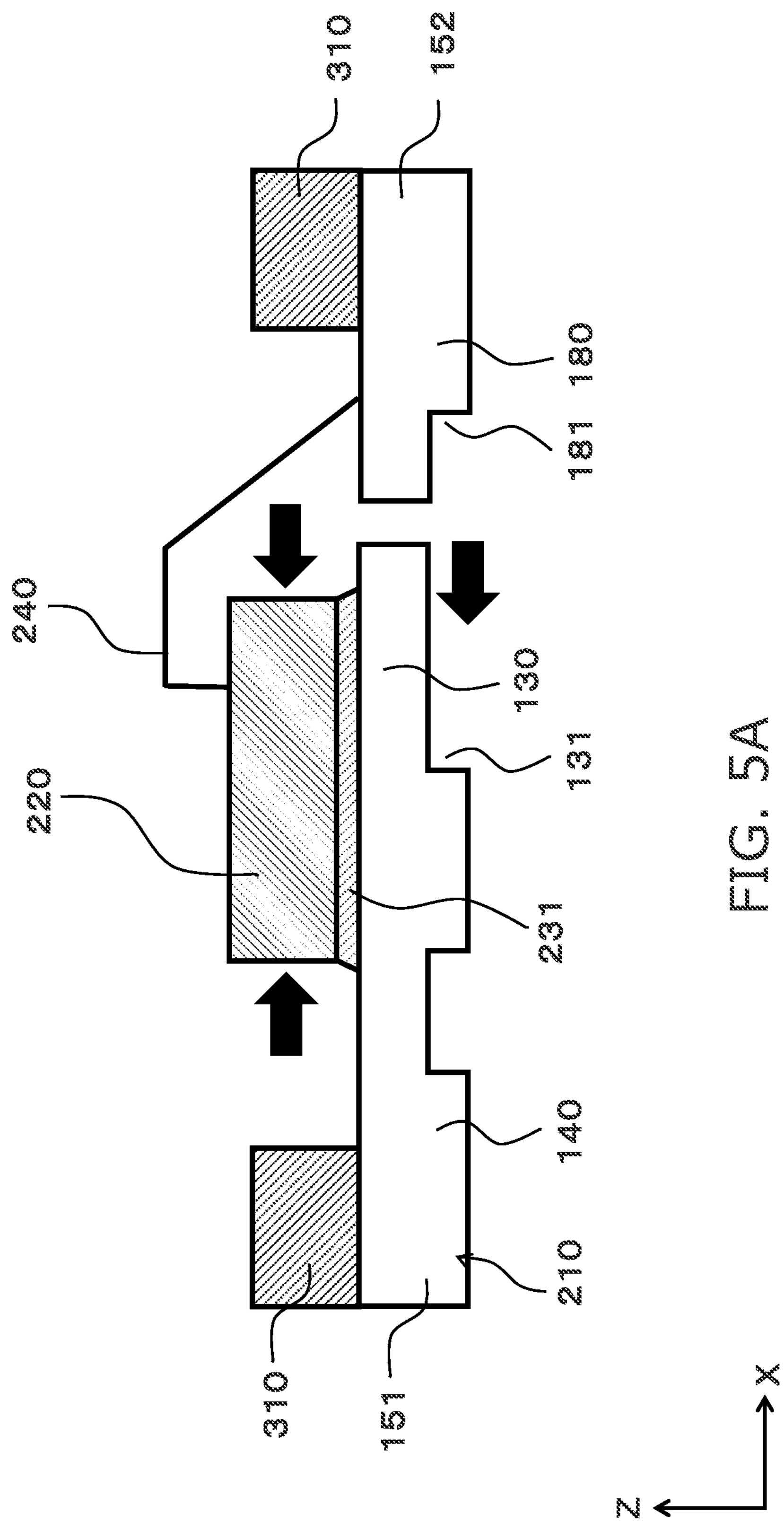
FIG. 5A is a cross-sectional view of the semiconductor device 400 when reducing the temperature of a reflow furnace until a melting point of a bonding material is reached.
Figure 5B:
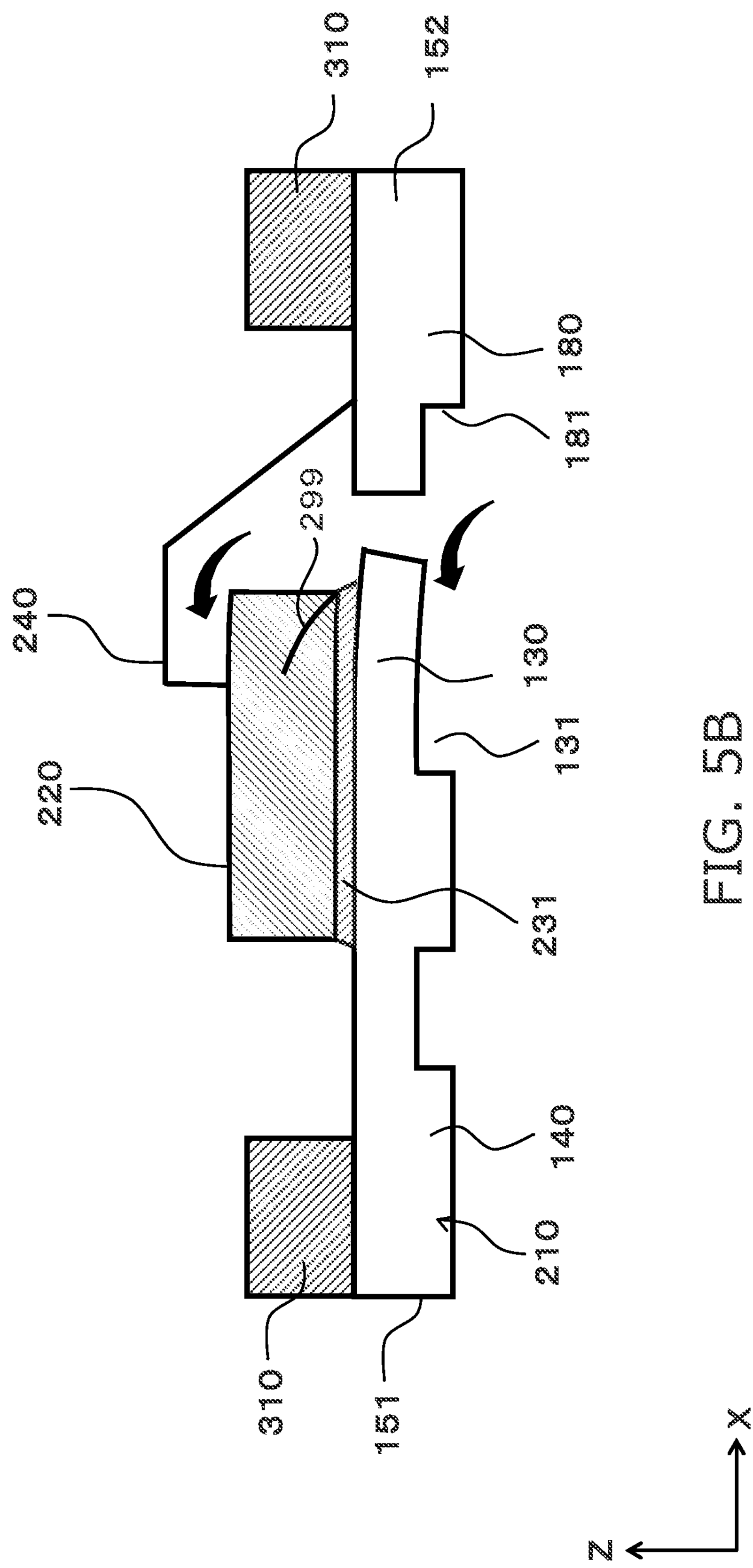
FIG. 5B is a cross-sectional view of the semiconductor device 400 when reducing the reflow furnace at a temperature that is less than the melting point of the bonding material.

FIGS. 5A and 5B are cross-sectional views when manufacturing the semiconductor device 400 of the comparative example. FIG. 5A is a cross-sectional view of the semiconductor device 400 when reducing the temperature of a reflow furnace until the melting point of the bonding material is reached; and FIG. 5B is a cross-sectional view of the semiconductor device 400 when reducing the temperature of the reflow furnace in which the temperature is less than the melting point of the bonding material.

The method for manufacturing the semiconductor device 400 of the comparative example will now be described. The temperature of the reflow furnace is increased to use the bonding material 231 to connect the drain electrode at the lower surface of the semiconductor element 220 and the bed portion 130 in which the first extension portion 160 and the second extension portion 170 are not included.

At this time, the bed portion 130 undergoes thermal expansion due to the temperature increase. Although the semiconductor element 220 that is placed on the bed portion 130 also undergoes thermal expansion, generally, the linear expansion coefficient of the leadframe is greater than the linear expansion coefficient of the semiconductor element; therefore, the expansion amount of the bed portion 130 is greater than the expansion amount of the semiconductor element 220. For example, when a major material of the leadframe is Cu and a major material of the semiconductor element is Si, the linear expansion coefficient of Cu is $1.7\times10^{-5}$; and the linear expansion coefficient of Si is $2.8\times10^{-6}$.

Continuing, the temperature of the reflow furnace is reduced to fix the bonding material 231. At this time, although both the bed portion 130 and the semiconductor element 220 that expanded when increasing the temperature contract, the linear expansion coefficient of the bed portion 130 is greater than the linear expansion coefficient of the semiconductor element 220; therefore, the contraction amount of the bed portion 130 is greater than the contraction amount of the semiconductor element 220. As shown in FIG. 5A, the semiconductor element 220 and the bed portion 130 contract in the X-direction until the melting point of the bonding material 231 is reached. When the melting point of the bonding material 231 is reached when reducing the temperature, the bed portion 130 and the semiconductor element 220 are adhered via the bonding material 231.

When the temperature is further reduced, the bed portion 130 and the semiconductor element 220 continue to contract, but the bed portion 130 and the semiconductor element 220 are adhered via the bonding material 231. Therefore, the surface area of the section at which the bed portion 130 and the semiconductor element 220 are adhered must be constant.

At this time, bending stress is generated so that the length in the X-direction of the bed portion 130 that has the large contraction amount is reduced; and the bed portion 130 and the semiconductor element 220 distort to be convex toward the semiconductor element 220 mounting side. As shown in FIG. 5B, there is a risk that the distortion that is caused by the bending stress may cause cracks 299 to occur in the semiconductor element 220. In particular, when the thickness of the bed portion 130 is less than the thickness of the semiconductor element 220, the distortion becomes large, and cracks 299 easily occur in the semiconductor element 220.

To relax the bending stress such as that shown in FIG. 5B, there is a method in which the first thin plate portion 131 is not included in the bed portion 130, that is, the thickness in the Z-direction of the bed portion 130 is increased. However, it is desirable for the fill volume of the resin 250 to be large to ensure the breakdown voltage and suppress shorts in the region where the second lead portion 180 approaches the bed portion 130 to which a different potential is applied. Therefore, from the perspective of the reliability of the semiconductor device, it is desirable to ensure the fill volume of the resin 250 by providing the first thin plate portion 131 in the bed portion 130 and by providing the second thin plate portion 181 in the second lead portion 180.

Taking into account the above description, effects of the method for manufacturing the semiconductor device 200 according to the first embodiment will now be described. As shown in FIG. 3A, the first support portion 151 and the second support portion 152 are fixed by the fixing member 310; and the temperature of the reflow furnace is increased in the state in which the semiconductor element 220 is placed on the bed portion 130 with the bonding material 231 interposed. Here, the first support portion 151 and the second support portion 152 are fixed by using, for example, pins, etc.; and the movement in the X-Y-Z-directions is suppressed.

Then, the bonding material 231 is fixed by gradually reducing the temperature of the reflow furnace. Here, the bed portion 130 is connected via the first and second extension portions 160 and 170 in the X-direction to the second support portion 152 that is fixed with the fixing member 310. Because the bed portion 130 end portion at which bending stress is easily generated is fixed by the second support portion 152, the bending stress that is caused by a linear expansion coefficient difference such as that shown in FIG. 5B can be suppressed. The convex-shaped distortion of the semiconductor element 220 and a portion of the first thin plate portion 131 of the first frame part 110 caused by the bending stress is suppressed thereby; therefore, by providing the first thin plate portion 131, the occurrence of cracks 299 in the semiconductor element 220 can be suppressed while improving the breakdown voltage and suppressing electrode shorts of the semiconductor device.

According to embodiments, a leadframe, a semiconductor device, and a method for manufacturing a semiconductor device can be provided in which the occurrence of cracks in a semiconductor element can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A leadframe, comprising:

a first frame part including a bed portion including a first section, a thickness in a first direction of the first section being thin, a first support portion, a first lead portion positioned between the bed portion and the first support portion in a second direction crossing the first direction, the first lead portion being connected with the bed portion and the first support portion, a first extension portion positioned at a side opposite to the first lead portion in the second direction, the first extension portion being connected to the bed portion, and a second extension portion separated from the first extension portion in a third direction crossing the first and second directions, the second extension portion being connected to the bed portion;

a second frame part including a second support portion connected to the first and second extension portions, and a second lead portion positioned between the bed portion and the second support portion in the second direction, the second lead portion being connected to the second support portion.

2. The leadframe according to claim 1, wherein the second lead portion includes a second section, and a thickness in the first direction of the second section is thin.

3. A semiconductor device, comprising:

a bed portion including a first section, a thickness in a first direction of the first section being thin;

a first lead portion connected with the bed portion;

a first extension portion connected to the bed portion at a side opposite to the first lead portion in a second direction crossing the first direction;

a second extension portion separated from the first extension portion in a third direction crossing the first and second directions, the second extension portion being connected to the bed portion;

a second lead portion located between the first extension portion and the second extension portion in the third direction, the second lead portion being separated from the bed portion;

a semiconductor element located on the bed portion; and a resin covering at least a part of the bed portion, the first lead portion, the first extension portion, the second extension portion, the second lead portion, and the semiconductor element.

4. The device according to claim 3, wherein the second lead portion includes a second section, and a thickness in the first direction of the second section is thin.

5. The device according to claim 3, wherein the second lead portion and an electrode of the semiconductor element are electrically connected by a current path member.

6. The device according to claim 3, wherein the semiconductor element is mounted on the first section.

7. The device according to claim 3, wherein at least a portion of a lower surface of the bed portion is not covered with the resin.

* * * * *